(12) United States Patent
Kapoor (10) Patent No.: US 7,804,332 B2
(45) Date of Patent: *Sep. 28, 2010

(54) CIRCUIT CONFIGURATIONS HAVING FOUR TERMINAL JFET DEVICES

(75) Inventor: Ashok Kumar Kapoor, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/506,848

(22) Filed: Jul. 21, 2009

(65) Prior Publication Data

US 2009/0278570 A1    Nov. 12, 2009

Related U.S. Application Data

(63) Continuation of application No. 11/452,442, filed on Jun. 13, 2006, now Pat. No. 7,592,841.

(60) Provisional application No. 60/799,787, filed on May 11, 2006.

(51) Int. Cl.
    *H03K 19/20*    (2006.01)
(52) U.S. Cl. .......................................... 326/121; 326/83
(58) Field of Classification Search ................... 326/37, 326/38, 101–104, 112, 119, 121
    See application file for complete search history.

(56) References Cited

U.S. PATENT DOCUMENTS

| 7,298,176 B2 * | 11/2007 | Ngo et al. ................... 326/119 |
| 7,592,841 B2 | 9/2009 | Kapoor |
| 2007/0013413 A1 * | 1/2007 | Chiang et al. ............... 326/121 |

* cited by examiner

*Primary Examiner*—Don P Le
(74) *Attorney, Agent, or Firm*—Haverstock & Owens, LLP (57) ABSTRACT

Circuits using four terminal junction field effect transistors (JFETs) are disclosed. Such circuits can include various static and dynamic logic circuits, flip-flops, multiplexer, tri-state driver, phase detector, logic having variable speeds of operation, and/or analog circuit with such four terminal JFETs operating in a linear or nonlinear mode.

20 Claims, 10 Drawing Sheets

CIRCUIT CONFIGURATIONS HAVING FOUR TERMINAL JFET DEVICES

This application is a continuation of U.S. patent application Ser. No. 11/452,442 filed on Jun. 13, 2006, now U.S. Pat. No. 7,592,841 which claims the benefit of U.S. Provisional Patent Application Ser. No. 60/799,787, filed May 11, 2006, the contents of which are incorporated by reference herein.

TECHNICAL FIELD

The present invention relates generally to semiconductor circuits, and more particularly to semiconductor circuits using junction field effect transistor (JFET) devices.

BACKGROUND OF THE INVENTION

Figure 19:
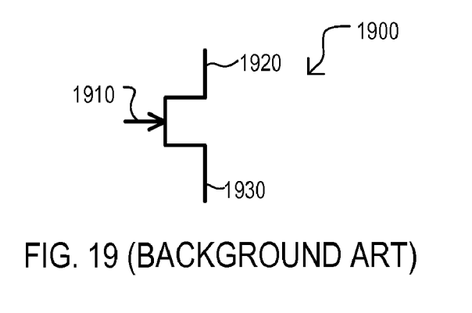
FIG. 19 is a schematic diagram of a conventional n-channel JFET.

Conventional junction field effect transistors (JFETs) are known. FIG. 19 shows a schematic diagram of a conventional n-channel JFET 1900. Conventional n-channel JFET operates as a three terminal device, including a control gate 1910, drain 1920, and source 1930. In operation, conventional JFET 1900 functions as a depletion mode device, providing a relatively low impedance path between source 1930 and drain 1920. In response to a voltage applied at control gate 1910, a depletion region can be altered to change the conductivity between source 1930 and drain 1920.

Currently, for most large scale integrated circuits, metal-oxide-semiconductor (MOS) type transistors are employed, due to perceived advantages over other transistor types, such as JFETs. Presently, most integrated circuits having logic functions are fabricated with complementary MOSFETs (CMOS) technology. CMOS employs both p-type MOSFETs and n-type MOSFETs. By doing so, at least one type of MOSFETs can be turned off in a steady state condition. In this way, steady state current may be reduced to transistor leakage current.

CMOS technology has long provided advantageous current leakage characteristics. However, as device feature sizes decrease, CMOS technology is approaching scaling limits. For example, as channel lengths of CMOS transistors decrease, a gate insulating layer thickness must be decreased in order to provide adequate control over the channel (and hence sufficiently turn the device off). Such thin gate insulating layers can become difficult or expensive to manufacture and/or lose integrity in operation or over time.

DETAILED DESCRIPTION OF THE EMBODIMENTS

Various embodiments of the present invention will now be described in detail with reference to a number of drawings. The embodiments show circuits formed with four-terminal (4T) junction field effect transistors (JFET), including complementary 4T JFETs.

The disclosed embodiments can include circuits formed with 4T JFETs of either n-channel or p-channel conductivity types. Such devices provide separate control of a channel between a source and drain by application of both a gate potential and a "back" gate potential. Two of the many possible configurations for such devices are shown in FIGS. 1A to 2F.

Figure 1A:
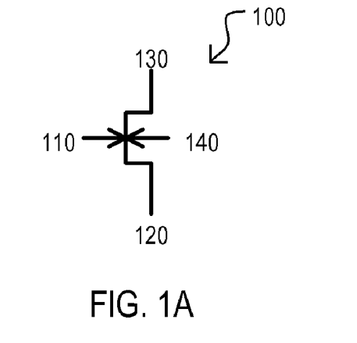
FIG. 1A is a circuit schematic diagram of a four terminal n-channel junction field effect transistor (4T NFET) according to an embodiment.

FIG. 1A is a schematic representation of a 4T n-channel JFET according to an embodiment, hereinafter referred to as a 4T NFET, and designated by the general reference character 100. A 4T NFET 100 can include a front gate 110, a source 120, a drain 130, a back gate (in this example a well) 140 and channel region 150. Both front gate 110 and back gate 140 can be used to control the channel impedance between the source 120 and drain 130.

Figure 1B:
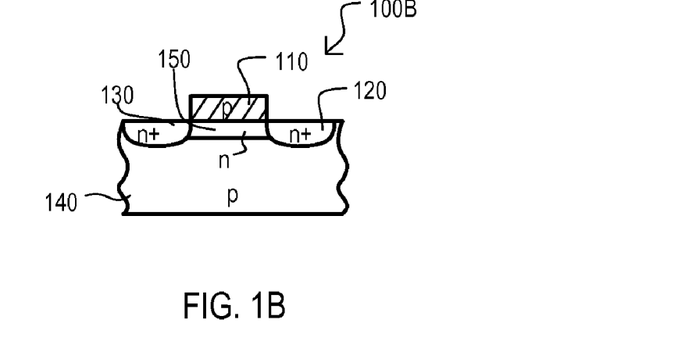
FIGS. 1B to 1F are various views showing examples of a 4T NFET like that of FIG. 1A.

FIG. 1B shows one example of a 4T NFET 100B in a cross sectional view. In this particular configuration, a front gate 110 can be formed from a p-type doped semiconductor material (i.e., polysilicon or amorphous silicon) over a substrate that includes an n-type channel 150. Source and drain (130 and 120) can be highly doped n-type regions on opposing sides of channel 150. A back gate 140 can be a p-type region formed opposite to front gate 110 with respect to n-type channel 150.

Figure 1C:
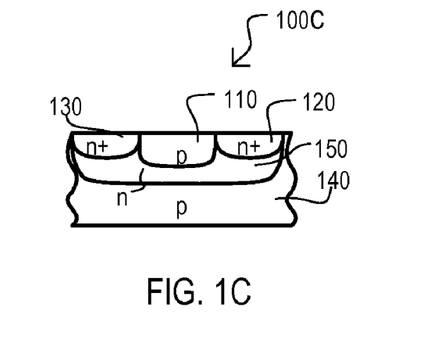

FIG. 1C shows another example of 4T NFET 100C in a cross sectional view. In this particular configuration, a front gate 110 can be formed from by a diffused p-type doped region in a semiconductor substrate. An n-type channel 150 can be formed below front gate 110 within the same substrate. A source and drain (130 and 120) can be highly doped n-type regions on opposing sides of channel 150. A back gate 140 can be a p-type region formed opposite to front gate 110 with respect to n-type channel 150 within the substrate.

Figure 1D:
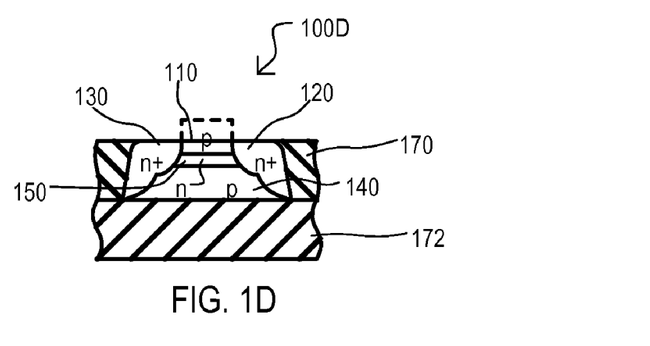

FIG. 1D shows a third example of 4T NFET 100D in a cross sectional view. The example of FIG. 1D shows a device implemented with silicon-on-insulator (SOI) technology. A source and drain (130 and 120) can be highly doped n-type regions on opposing sides of an n-type channel 150. A back gate 140 can be a p-type region formed opposite to front gate 110 with respect to n-type channel 150 within the substrate. Channel 150, source/drain 130/120, and back gate 140 can all be formed in an isolated section of semiconductor material (a "mesa" or "island") that is surrounded on side surfaces by isolation material 170, and isolated with respect to a bottom surface by isolation layer 172.

A front gate 110 can be formed from by a p-type doped region formed over the mesa, or can be a diffused p-type region within the mesa, or some combination thereof.

In the examples of FIGS. 1B, 1C and 1D, it is understood that a contact can be made to each back gate to allow separate control of the back gate with respect to the front gate.

Figure 1E:
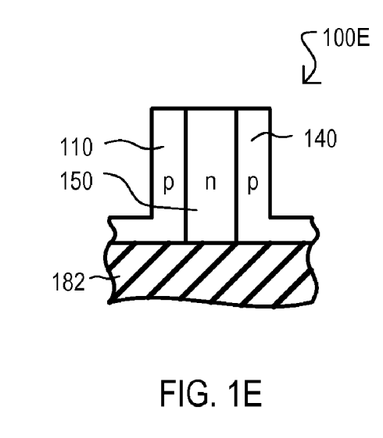
Figure 1F:
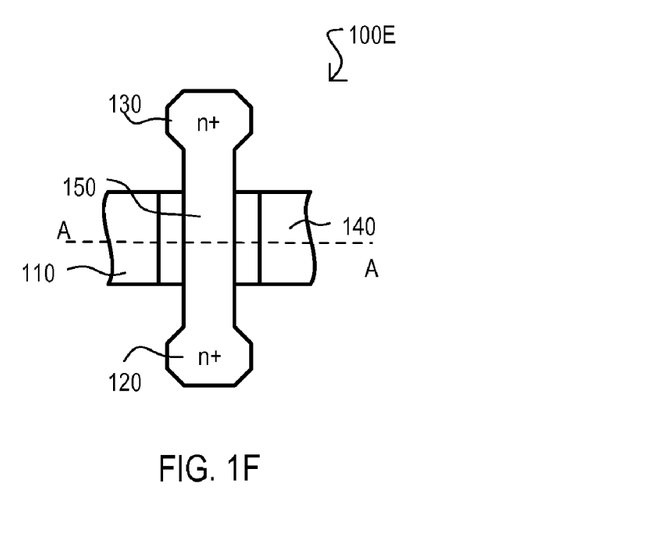

FIGS. 1E and 1F show a fourth example of 4T NFET 100E implemented with "fin" FET like configuration. FIG. 1E is a simplified side cross sectional view of a 4T NFET device in which a p-type front gate 110 can extend above a insulating substrate 182 on one side of an n-type channel region 150. A p-type back gate 140 is disposed similarly on an opposing side of channel region 150.

FIG. 1F is a top view of the same transistor, and further shows a source region 130 and drain region 120. It is understood that source region 130, drain region 120, and channel region 150 can be formed in a same section of semiconductor material extending above a surface of insulating substrate 182. Front gate 110 and back gate 140 can be formed from a same layer of semiconductor material (e.g., polysilicon and/or amorphous silicon) deposited over section of material containing source region 130, drain region 120 and channel region 150. Such a gate material can be etched, chemically-mechanically polished, or otherwise planarized to form two separate front and back gate electrodes.

Figure 2A:
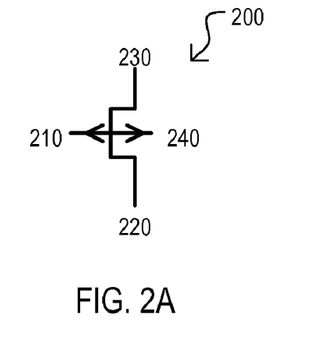
FIG. 2A is a circuit schematic diagram of a four terminal p-channel junction FET (4T PFET) according to an embodiment.
Figure 2B:
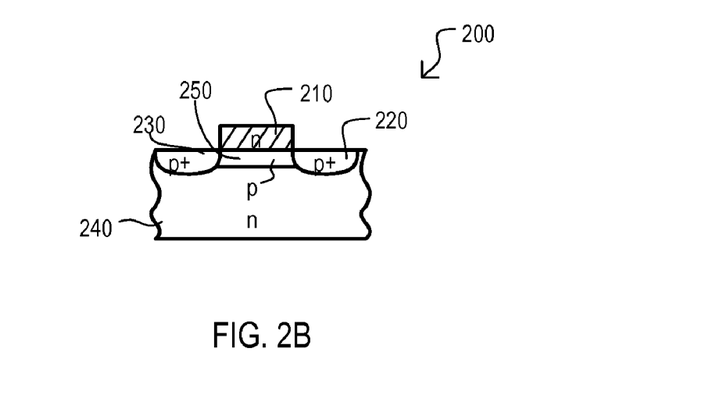
FIGS. 2B to 2F are various views showing a 4T PFET like that of FIG. 2A.
Figure 2C:
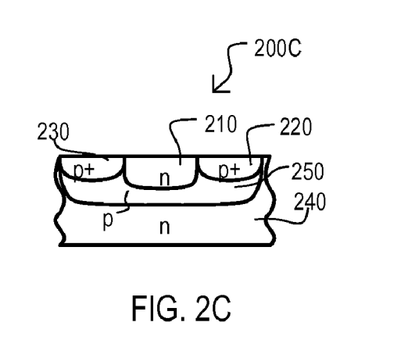
Figure 2D:
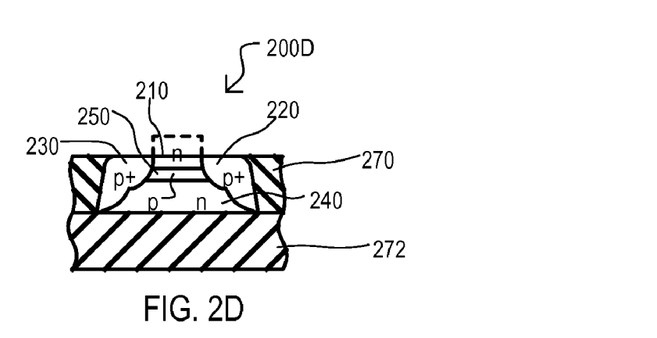
Figure 2E:
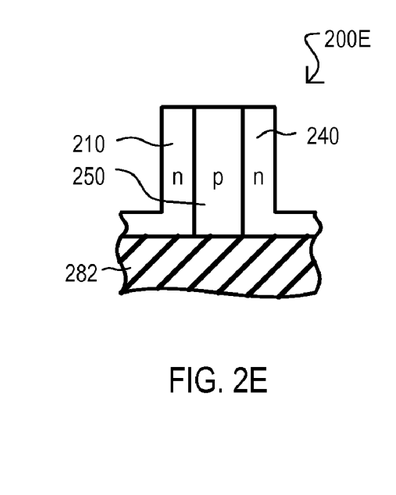
Figure 2F:
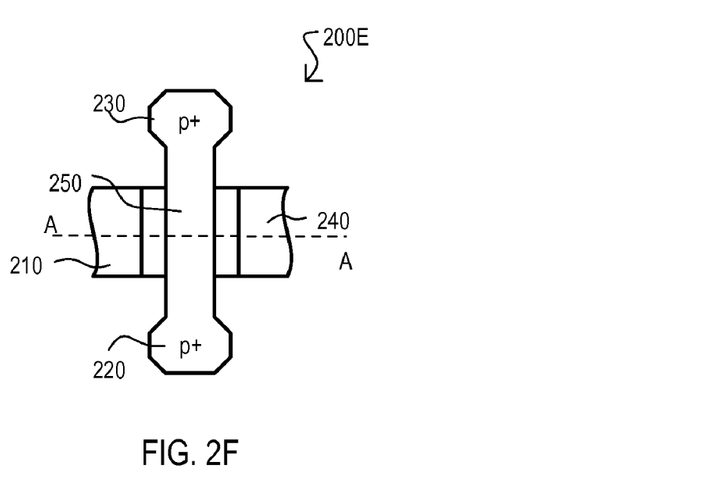

FIG. 2A is a schematic representation of a 4T p-channel JFET (PFET) 200. FIGS. 2B to 2F are various views of examples of a 4T PFET like that of FIG. 2A. A 4T PFET 200 can include the same general structures as NFET of FIGS. 1A to 1F, but with opposite conductivity type regions. Accordingly, like structures are shown with the same reference character, but with the first digit being a "2" instead of a "1".

Figure 3A:
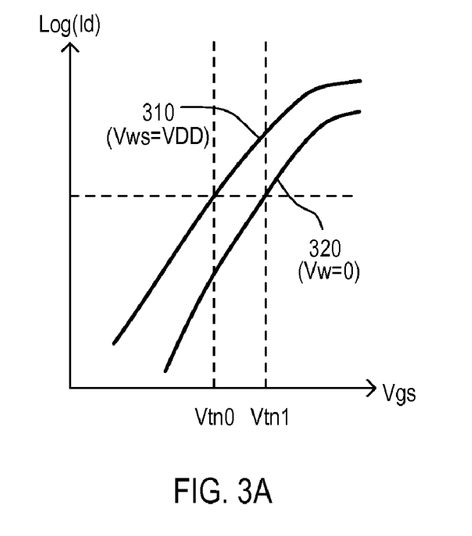
FIGS. 3A and 3B are current-voltage transfer characteristics for a 4T NFET like that of FIG. 2A.
Figure 3B:
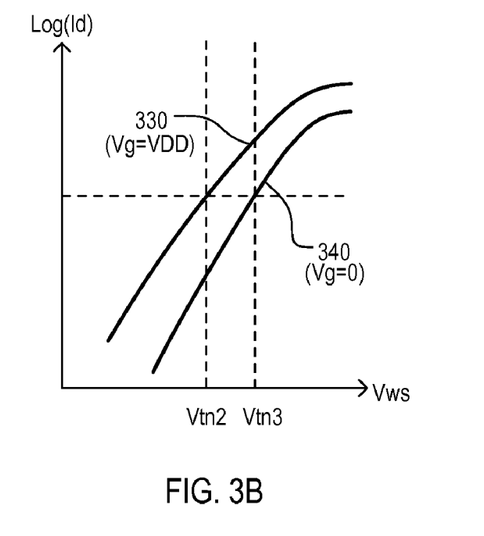

Both 4T NFET 100 and 4T PFET 200 can operate with channel conductivities that can be varied according to the potential applied at either a front gate or back gate. Referring now to FIG. 3A and FIG. 3B, current-voltage transfer characteristics for a 4T NFET, like that of FIGS. 1A to 1F is shown in a graph.

FIG. 3A shows a current Log(Id) versus a front gate-to-source voltage (Vgs) for a 4T NFET, which in this case, can be the voltage between a front gate 110 and source 130. FIG. 3A includes two lines: line 310 and 320. Line 310 is the current-voltage transfer characteristic when a back gate 140 is fixed at a high supply voltage VDD (or Vdd). A supply voltage (VDD) is understood to be slightly below the turn on diode voltage for the pn junction formed by the front gate/channel and back gate/channel. The turn on voltage of silicon based junction is about 0.7V. Hence, the VDD for such a silicon based circuit can be about 0.6V or less. Accordingly, for the rest of this document, VDD (and Vdd) will correspond to this value. Line 320 is the current-voltage transfer characteristic when the back gate 140 is fixed at ground (i.e., zero volts). As seen in line 310, when a back gate voltage is at a high supply potential (Vw=Vdd), JFET 100 can have a threshold voltage Vtn0. However as seen in line 320, when the back gate voltage is zero Vw=0, JFET 100 can have a threshold voltage Vtn1, where Vtn0 is less than Vtn1.

FIG. 3B shows the current versus a back gate-to-source voltage (Vws) for the 4T NFET, which is a voltage between a back gate 140 and source 130. FIG. 3B includes two lines. Line 330 is the current-voltage transfer characteristic when a front gate 110 is fixed at a high supply potential (Vdd) and line 340 is the current-voltage transfer characteristic when a front gate 110 is fixed at ground (i.e. zero volts). As seen in line 330, when a front gate voltage Vg=Vdd, 4T NFET 100 can have a threshold voltage Vtn2. However as seen in line 340, when a front gate voltage Vg=0, 4T NFET 100 can have a threshold voltage Vtn3, where Vtn2 is less than Vtn3.

In this way, a 4T NFET or PFET can be controlled via a front gate voltage, back gate voltage, or both.

According to an applied gate voltage and/or a manufactured threshold voltage, a 4T FET can operate in various different modes. Two particular modes will now be described. A 4T FET can operate to provide a low impedance path in response to either a front gate or back gate voltage. Such a devices will be referred to herein as a "single gate depletion device" (SD). Thus, in the case of a SD 4T NFET, when a gate-to-source voltage of either or both a front gate and back gate are at a high bias voltage (e.g., less than a pn junction forward bias voltage but greater than zero), then the SD 4T NFET can be turned on (i.e., provide a relatively low conductivity path). However, when both the front gate and back gate is biased at zero volts with respect to source, the channel is "pinched off" and the SD 4T NFET is turned off (i.e., provide a relatively high conductivity path between drain and source).

Figure 3C:
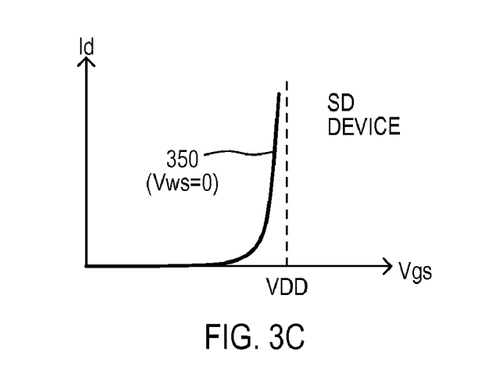
FIGS. 3C and 3D are current-voltage characteristics of a single gate depletion (SD) 4T NFET according to an embodiment.
Figure 3D:
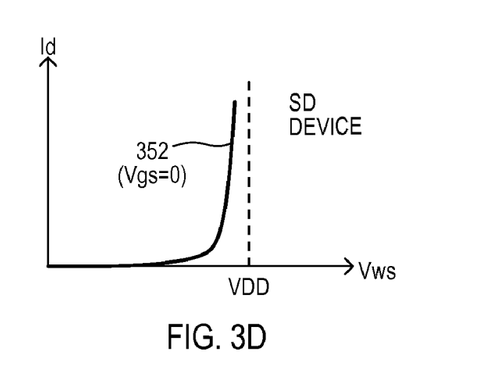

The operation of a SD 4T NFET is represented by graphs in FIGS. 3C and 3D. FIG. 3C shows how a front gate voltage (Vgs) can provide a high drain current even when a back gate (Vws) is biased to zero volts, without having to exceed a supply voltage VDD. Similarly, FIG. 3D shows how a back gate voltage (Vws) can provide a high drain current at levels below VDD, even when a front gate (Vgs) is biased to zero.

Similarly, in the case of a SD 4T PFET, when a gate-to-source voltage of both a front gate and back gate are at a high bias voltage (e.g., VDD), then the 4T PFET can be turned off. However, when either or both the front gate and back gate is biased at a low supply voltage (e.g., 0 volts) with respect to source (and below the turn on voltage of PN junction), then the SD 4T PFET can be turned on.

A 4T FET can also operate to provide a low impedance path in response to both a front gate and back gate voltage within a power supply range. Such a device will be referred to herein as a "single gate enhancement mode device"(SE).

Thus, in the case of an SE 4T NFET, when a gate-to-source voltage of both a front gate and back gate are at a high bias voltage (e.g., less than a pn junction forward bias voltage but greater than zero), then the SE 4T NFET can be turned on (i.e., provide a relatively low conductivity path). However, when one gate is biased at zero volts, the SE 4T NFET can remain turned off, regardless of the other gate voltage (assuming a limited operating voltage range within VDD).

Figure 3E:
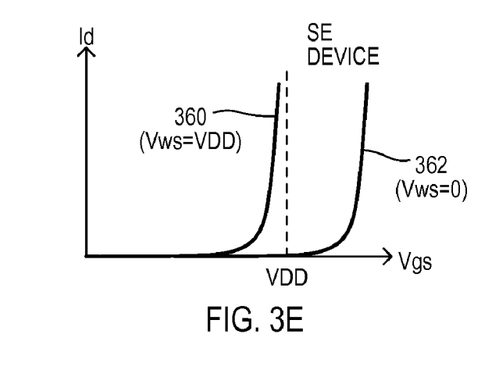
FIGS. 3E and 3F are current-voltage characteristics of a single gate enhancement (SE) 4T NFET according to an embodiment.
Figure 3F:
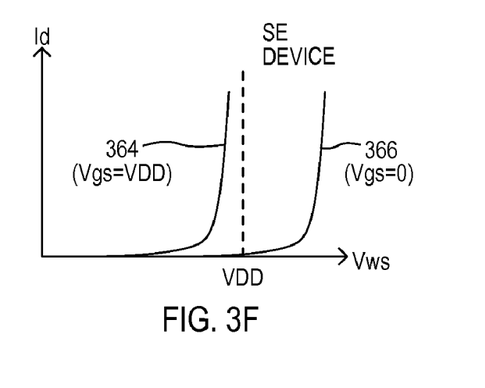

The operation of a SE 4T NFET is represented by graphs in FIGS. 3E and 3F. FIG. 3E shows how a front gate voltage (Vgs) can provide a high drain current when a back gate (Vws) is biased to VDD. However, if a back gate voltage (Vws) is biased to zero volts, then a front gate voltage (Vgs) would have to exceed a power supply voltage VDD in order to provide a high drain current. Similarly, FIG. 3D shows how a back gate voltage (Vws) can provide a high drain current even when a front gate (Vgs) is biased to VDD, but cannot provide a high drain current at levels below VDD when a front gate is biased to zero volts.

Of course, the operation of 4T PFETs as single gate depletion devices or single gate enhancement devices is understood from the above discussion. That is, for SE 4T PFETs, if one gate is biased to a low supply voltage, the SE 4T PFET could only provide a high drain current by driving the other gate at a low supply voltage. As will be noted later on, 4T JFETs according to the embodiments can operate in intermediate modes, rather than just switching modes (i.e., on or off).

In this way, circuits can include complementary 4T JFET devices. That is, 4T JFET devices can be used of both n-type and p-type conductivity.

By employing complementary 4T FETs, as described above, logic functions can be executed with fewer devices than a conventional CMOS approach. While the following embodiments show particular logic circuits, these circuits are but examples of the many possible implementations that would be understood by those skilled in the art. The present invention is by no means limited to these particular examples.

Figure 4A:
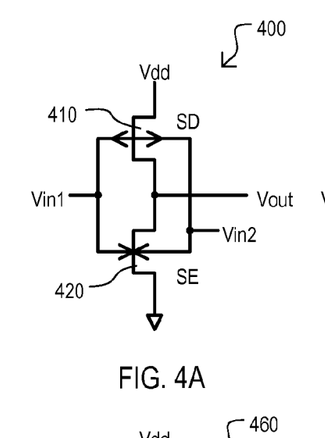
FIGS. 4A to 4D are circuit schematic diagrams of logic circuits according to various embodiments.

Referring now to FIG. 4A, a circuit schematic diagram of a two device logic circuit according to one embodiment is set forth and given the general reference character 400. Logic circuit 400 includes complementary 4T FETs, including a 4T PFET 410 and a 4T NFET 420. 4T PFET 410 may have a source connected to a power supply Vdd, a drain connected to an output node Vout, a front gate connected to first input node Vin1, and a back gate (e.g., well) connected to a second input node Vin2. 4T NFET 420 may have a source connected to a ground terminal, a drain connected to an output node Vout, a front gate connected to a first input node Vin1, and a back gate (well) connected to second input node Vin2, and a source connected to a low power supply level Vss.

First input node Vin1 can be conceptualized as being connected to "front gates" of 4T FETs (410 and 420). Second node Vin2 may be conceptualized to be connected to "back gates" of 4T FETs (410 and 420).

Logic levels provided to and output from logic circuit 400 can be essentially power supply voltage Vdd for a logic one, and a logic zero can be essentially ground or zero volts. Two device logic circuit 400 can function according to the truth table shown in Table 1 below.

TABLE 1

| Vin1 | Vin2 | Vout |
|------|------|------|
| 0 | 0 | Vdd |
| Vdd | 0 | Vdd |
| 0 | Vdd | Vdd |
| Vdd | Vdd | 0 |

As would be understood from the above table, two device logic circuit 400 can provide a logic function of an inverter with respect to one signal (by maintaining the other signal at a constant level). However, the same logic circuit 400, incorporating only two devices, also functions as a NAND gate. This is in sharp contrast to a conventional complementary metal-oxide-semiconductor (CMOS) NOR gate that can require four transistors (two n-channel MOSFETs and two p-channel MOSFETs). In this way, using complementary 4T JFET devices, a two device circuit 400 can provide an equivalent function with fewer transistors than a CMOS implementation. In this way, the size of an integrated circuit can be reduced over conventional CMOS approaches.

It is understood that in the above arrangement, 4T NFET 420 operates as a single gate enhancement mode device, while 4T PFET 410 operates as a single gate depletion mode device.

Figure 4B:
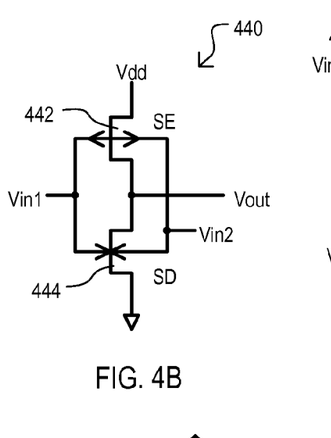

FIG. 4B shows another two device circuit 440, like that of FIG. 4A. However, in FIG. 4B, 4T PFET 442 can be a single gate depletion (SD) device and 4T NFET 444 can be a single gate enhancement (SE) device. From the above discussion, it is understood that circuit 440 can operate as a NOR gate. Again, such a device can include two 4T FET devices, in contrast to a CMOS implementation which would include four MOS transistors.

Figure 4C:
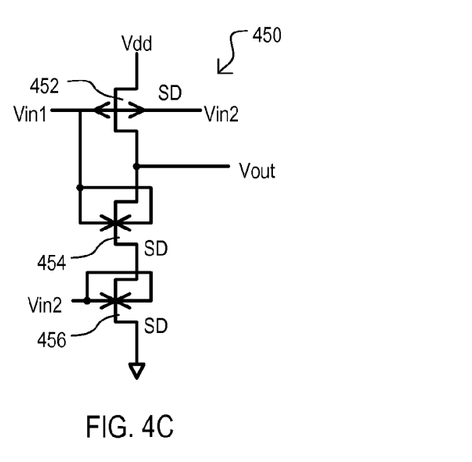

FIG. 4C shows a circuit schematic diagram of a three device logic circuit according to one embodiment is given the general reference character 450. Logic circuit 450 includes three 4T FETs, including a 4T PFET 452, a first 4T NFET 454, and a second 4T NFET 456. 4T PFET 452 may have a source connected to a power supply Vdd, a drain connected to an output node Vout, a front gate connected to first input node Vin1, and a back gate (e.g., well) connected to a second input node Vin2.

Unlike the arrangements of FIG. 4A or 4B, in the embodiment of FIG. 4C, the 4T FETs are all SD 4T FETs. Consequently, first 4T NFET 454 can have a drain connected to output node Vout, a source connected to the drain of 4T NFET 456, a front gate and back gate connected to first input node Vin1. Second 4T NFET 456 can have a source connected to a low power supply node Vss, a front gate and back gate connected to second input node Vin2.

Figure 4D:
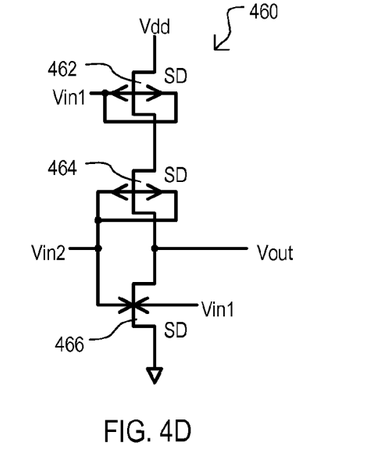

In the above arrangement, the three transistor circuit can operate as a NOR gate. FIG. 4D shows a circuit schematic diagram of a three device logic circuit according to yet another embodiment 460. Logic circuit 460 includes three 4T FETs, including a first 4T PFET 462, a second 4T PFET 464, and a 4T NFET 466. First 4T PFET 462 may have a source connected to a power supply Vdd, a drain connected to a source of second 4T PFET 464, a front gate connected to a second input node Vin1, and a back gate (e.g., well) connected to a low logic level "LOGIC LOW". Second 4T PFET 464 may have a drain connected to an output node Vout, a front gate connected to a second input node Vin2, and a back gate connected to "LOGIC LOW".

Again, unlike the arrangement of FIGS. 4A and 4B, in the embodiment of FIG. 4D all the 4T FETs are single gate depletion devices.

In the above arrangement, the three transistor circuit can operate as a NAND gate. In this way, logic circuits can be formed from only SD type 4T FETs The operation of 4T FETs as either SE or SD devices can enable relatively simple translation between conventional CMOS logic circuits and logic circuits formed with 4T FETs as disclosed herein. One example of such a translation is shown in FIGS. 4E to 4H.

Figure 4E:
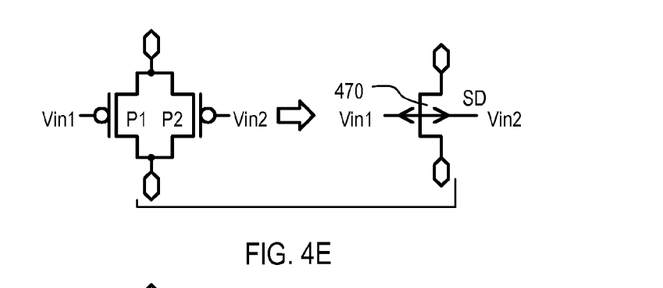
FIGS. 4E to 4H show how complementary metal-oxide-semiconductor (CMOS) logic circuit functions can be translated to complementary 4T FET circuit arrangements.
Figure 4F:
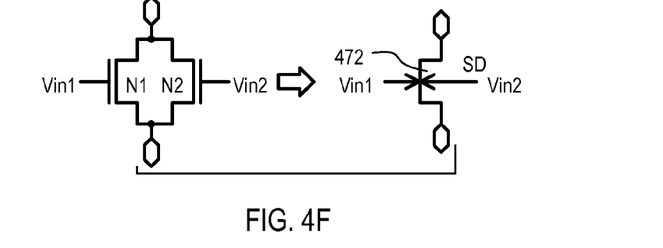

FIG. 4E shows how the logic functionality of two CMOS p-channel MOSFETs having source-drain paths arranged in parallel with one another can be translated to a single SD 4T PFET 470. Similarly, FIG. 4F shows how the logic functionality of two CMOS n-channel MOSFETs having source-drain paths arranged in parallel with one another can be translated to a single SD 4T NFET 472.

Figure 4G:
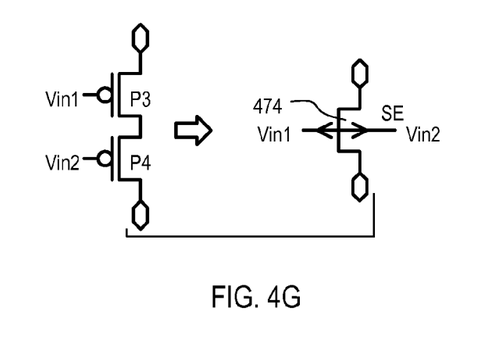
Figure 4H:
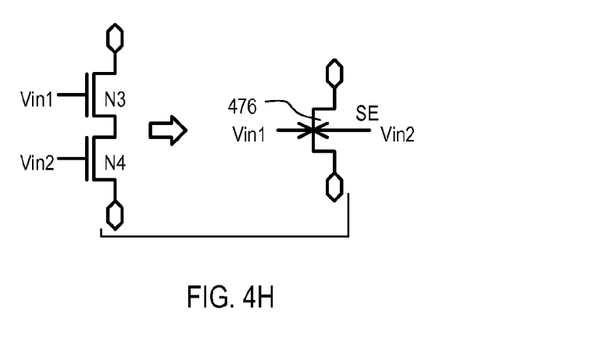

FIG. 4G shows how the logic functionality of two CMOS p-channel MOSFETs having source-drain paths arranged in series with one another can be translated to a single SE 4T PFET 474. Similarly, FIG. 4H shows how the logic functionality of two CMOS n-channel MOSFETs having source-drain paths arranged in series with one another can be translated to a single SD 4T NFET 476.

Of course, in the above examples, the 4T FETs are understood to operate within the limited voltage levels noted above, and not standard CMOS levels.

Figure 4I:
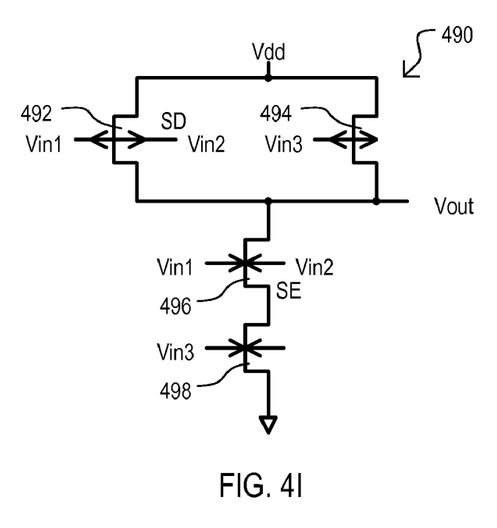
FIG. 4I is a circuit schematic diagram of a three input logic circuit according to an embodiment.

FIG. 4I shows how a three input CMOS NAND gate, that would include six MOSFET transistors, can be translated into a circuit having four 4T FETs. In particular, a conventional 3-input CMOS NAND gate would include three PMOS devices having source-drain paths arranged in parallel with one another between a high power supply voltage and an output node. Such three PMOS devices can be translated into a SD 4T PFET 492 and a 4T PFET 494 having source-drain paths arranged in parallel with one another. A 4T PFET 494 can be an SD or SE device.

Similarly, a conventional 3-input CMOS NAND gate would include three NMOS devices having source-drain paths arranged in parallel with one another between an output node and a low power supply node. Such three NMOS devices can be translated into one SE 4T NFET 496 and a 4T NFET 498 having source-drain paths arranged in series with one another. A 4T NFET 498 can be an SD or SE device.

Figure 5:
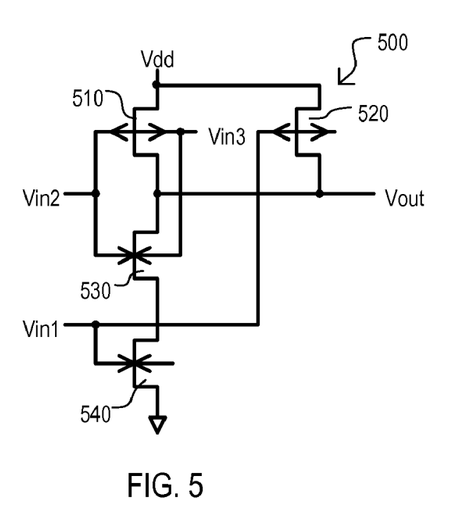
FIG. 5 is a circuit schematic diagram of a complex logic gate according to an embodiment.

Referring now to FIG. 5, a circuit schematic diagram of a more complex logic circuit according to an embodiment is set forth and given the general reference character 500. Complex logic circuit 500 can have three input terminals (Vin1 to Vin3) and provides an output signal via output terminal Vout.

Complex logic gate 500 can include 4T PFETs (510 and 520) and 4T NFETs (530 and 540). It is noted that in the configuration of FIG. 5, when the 4T FETs are controlled only by their front gates, the circuit arrangement follows that of a 2-input NAND gate. However, when one or more such devices are controlled separately by both front and back gates, different circuit functions can be implemented. In the example shown, 4T FETs (510 and 530) can be configured essentially the same way as two-input inverter 400 of FIG. 4A except that a source of 4T NFET 530 can be connected to a drain of 4T NFET 540. Front gates of 4T FETs (510 and 530) can be connected to first input node Vin2. Back gates of 4T FETs (510 and 530) can be connected to second input node Vin3. 4T PFET 520 can have a source connected to power supply Vdd, a drain connected to output node Vout and have a front gate connected to input node Vin1, and 4T NFET 540 may have a drain connected to a source of JFET 530, a source connected to ground, and a front gate connected to first input node Vin1.

It is noted that 4T FETs (520 and 540) can be configured to operate in a three terminal mode. For example, 4T PFET 520 can have a back gate connected to a ground, thus allowing a front gate to control the operation of the device. Similarly, 4T NFET 540 can have a back gate connected to a high power supply Vdd, thus allowing a front gate to control the operation of the device.

Complex logic circuit 500 can operate according to the truth table shown below in Table II.

TABLE II

| Vin1 (A) | Vin2 (B) | Vin3 (C) | Vout (Q) |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 1 | 0 | 0 |
| 1 | 0 | 1 | 0 |
| 1 | 1 | 1 | 0 |

The Boolean logic equation for the truth table of Table II is:

$$Q=\overline{(A+B)\cdot C}$$

In this way, various static logic gate functions can be created utilizing complementary 4T FETs, which can have much reduced device current as compared to MOS type devices.

The present invention is not limited to only static logic implementation. Other embodiments can be directed to dynamic logic circuits. One of the many possible dynamic logic circuits is set forth in a circuit schematic diagram in FIG. 6 and given the general reference character 600.

Figure 6:
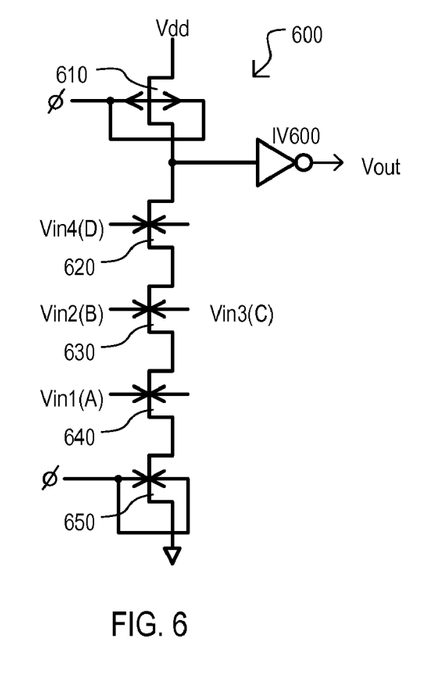
FIG. 6 is a circuit schematic diagram of a dynamic logic circuit according to an embodiment.

Dynamic logic gate 600 can receives input signals via first through fourth input nodes Vin1 to Vin4, as well as a clock signal φ. An output signal can be provided at output node Vout. Alternatively, 4T PFET 610 can have a back gate connected to Vdd. Dynamic logic gate 600 can include 4T PFET 610, a number of 4T NFETs (620, 630, and 640), a discharge 4T NFET 650, and an inverter IV600.

4T PFET 610 can have a front and back gate commonly connected to clock input clock, a source connected to power supply Vdd, and a drain connected to an input of inverter IV600. 4T NFET 620 can have a drain connected to the input of inverter IV600, a source connected to a drain of 4T NFET 630, and a front gate connected to fourth input node Vin4. 4T NFET 630 can have a front gate connected to second input node Vin2, a back gate connected to third input node Vin3, and a source connected to a drain of 4T NFET 640. 4T NFET 640 can have a gate connected to a first input node Vin1 and a source connected to a drain of 4T NFET 650. 4T NFET 650 can have a front and back gate commonly connected to clock node clock and a source connected to ground. Alternatively, 4T NFET 650 can have a back gate connected to ground.

4T NFETs 620 and 640 can also be configured to operate in a three terminal mode, as described above.

Inverter 600 can provide an output signal at output node Vout.

Referring still to FIG. 6, dynamic logic gate 600 can form a domino type logic circuit. When clock signal at node clock is at a low logic level, 4T PFET 610 can be in a low impedance state and the input of inverter IV600 can be precharged to a high level, while 4T NFET 650 can be in a high impedance state. Subsequently, when a clock signal at node clock transitions to a high logic level, 4T PFET 610 can be placed into a high impedance state, while 4T NFET 650 can be placed into a low impedance state. With 4T NFET 650 in a low impedance state, remaining 4T NFETs (620, 630, and 640)

can either pull the input of inverter IV600 to a low level or keep the input of inverter 600 in the precharged (high) state in accordance with the logic values at input nodes Vin1 to Vin4.

Dynamic logic gate 600 can form the following logic function where Vin1=A, Vin2=B, Vin3=C, Vin4=D and Vout=Q.

$$Q=A \cdot (B+C) \cdot D$$

However, by configuring either of the other 4T NFETs (e.g., 620 or 640) to operate in a four terminal mode, additional complex logic functions can be implemented. As one of the many possible functions, if 4T NFET 640 is modified to receive an input signal (E) at its back gate and 4T NFET 620 is modified to receive an input signal (F) at its back gate, a more complex dynamic logic gate can be created having a logic function as follows:

$$Q=(A+E) \cdot (B+C) \cdot (D+F).$$

A dynamic logic gate, like that illustrated in FIG. 6, can have the advantage of forming complex logic functions with fewer devices (JFETs). Furthermore, by providing 4T FET (e.g., 650) as an enable device, formed in series with logic determining devices (e.g., 620, 630, and 640), glitches and power consumption may be reduced.

Figure 7:
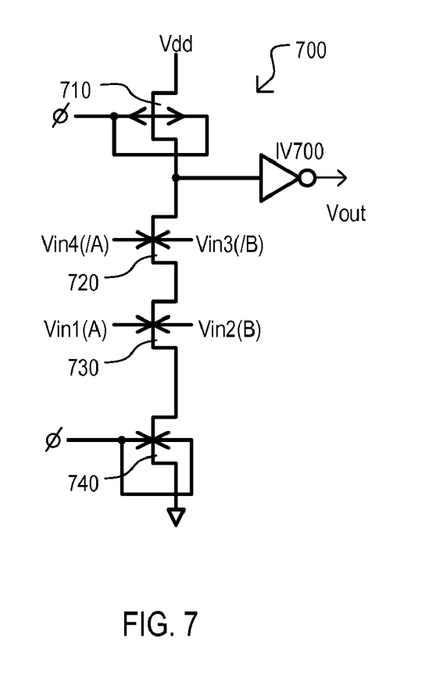
FIG. 7 is a circuit schematic diagram of another dynamic logic circuit according to another embodiment.

Referring now to FIG. 7, a dynamic logic gate according to an embodiment is set forth in a circuit schematic diagram and given the general reference character 700.

Dynamic logic gate 700 can receive a clock signal φ at clock input clock, input signals at first through fourth input nodes Vin1 to Vin4, and provides an output signal Vout. Dynamic logic gate 700 can include 4T PFET 710, 4T NFETs (720, 730, and 740), and an inverter IV700.

4T PFET 710 can have a source connected to power supply node Vdd, a drain connected to an input of inverter IV700, and can have front and back gates commonly coupled to clock node clock. 4T NFET 720 can have a drain connected to the input of inverter IV700, a source connected to a drain of 4T NFET 730, a front gate connected to input node Vin4, and a back gate connected to input node Vin3. 4T NFET 730 can have a front gate connected to input node Vin1, a back gate connected to input node Vin2, and a source connected to a drain of 4T NFET 740. 4T NFET 740 can have front and back gates commonly connected to clock node clock and a source connected to ground. Inverter IV700 can provide an output signal at node Vout.

Dynamic logic gate 700 operates as a domino logic circuit clocked by clock signal at node clock in the same manner as dynamic logic gate 600 of FIG. 6. However, if input signal at node Vin1 corresponds to "A", input signal at node Vin2 corresponds to "B", input signal at node Vin4 corresponds to "/A" (the inverse of A) and input signal at node Vin3 corresponds to "/B" (the inverse of B), then dynamic logic gate can form an exclusive OR (XOR) gate. Such a gate can function according to the following relationship, commonly known as an exclusive OR (XOR) function:

$$Q=(A+B) \cdot (/A+/B) \text{ or } Q=(A \cdot /B+/A \cdot B)=A \oplus B.$$

Figure 8A:
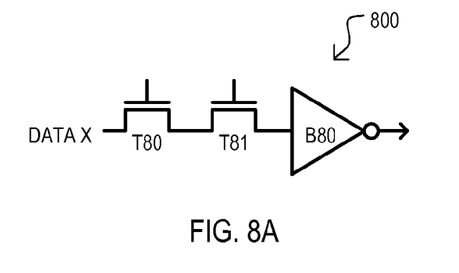
FIG. 8A is a schematic diagram of a conventional multiplexer circuit implemented with MOS technology.
Figure 8B:
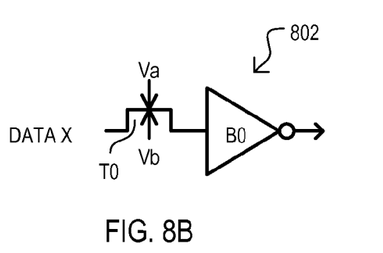
FIG. 8B is a schematic diagram of a multiplexer circuit according to an embodiment.
Figure 8C:
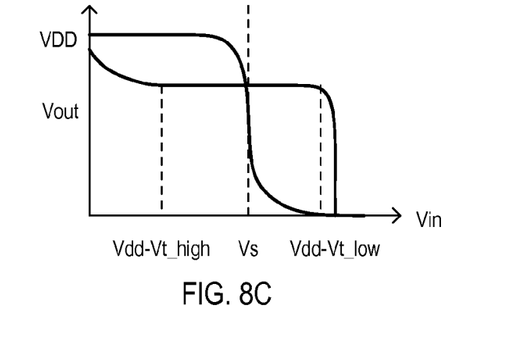
FIG. 8C is a graph showing the operation of the circuit of FIG. 8B.

The present invention is not limited to logic circuits having devices operating at a single threshold voltage. By altering one gate (e.g., back or front), a threshold voltage of a 4T FET can be varied. One of the many possible circuits implementing this technique is shown in FIGS. 8A to 8C. FIG. 8A shows a section of a conventional data switch implemented with standard MOSFET technology 800. N-channel MOSFET (NMOS) transistors T80 and T81 are used to steer data DATA X to inverting buffer B80. Inverting buffer B80 can switch an output value level when the input voltage to inverting buffer B80 exceeds the switching threshold (Vs) of the inverting buffer. When DATA X goes to a high supply voltage Vdd (conv), the voltage at the input of inverting buffer B80 can be Vdd(conv)−Vth, where Vth is the threshold voltage of transistors T80 and T81. A voltage Vdd(conv) can be a conventional high power supply voltage level, as opposed to the VDD levels referred to in the various embodiments. Given that [Vdd(conv)−Vth]>Vs, the inverting buffer switches the output value.

FIG. 8B shows a data switch according to one embodiment of the invention. In FIG. 8B, a single 4T NFET device can be used in lieu of two NMOS transistors. In the example shown, a data switch 802 can include 4T NFET T0 having a source-drain path coupled between input node DATA X and an input to an inverting buffer B0. Multiplexing operation can be achieved by changing the threshold voltage of 4T NFET T0 by biasing the front gate and/or back gate selectively, with inputs Va and Vb. In the particular example shown, a back gate can be biased with a potential Vb to alter the threshold voltage presented by 4T NFET. In more detail, when a back gate bias voltage Vb is low, a threshold voltage (Vth) can be relatively high, and a resulting maximum input voltage (Vin) to inverting buffer B0 can be limited as follows:

$$Vb=\text{Low}, Vth=Vt\_\text{high}, Vin\_1=Vdd-Vt\_\text{high}.$$

In this biasing arrangement, if Vin_1<Vs, inverting buffer B0 does not switch.

However, when a back gate bias voltage Vb is high, a threshold voltage (Vth) can be relatively low, and a resulting input voltage (Vin) to inverting buffer B0 can be increased as follows:

$$Vb=\text{High}, Vth=Vt\_\text{low}, Vin\_2=Vdd-Vt\_\text{low}$$

(where Vt_high>Vt_low).

In this biasing arrangement, if Vin_2<Vs, the inverting buffer B0 changes state.

FIG. 8C shows a response for a circuit like that shown in FIG. 8B.

In this way, either gate (e.g., front or back) can be biased to introduce threshold voltage variations in a 4T JFET device of a circuit.

Figure 9A:
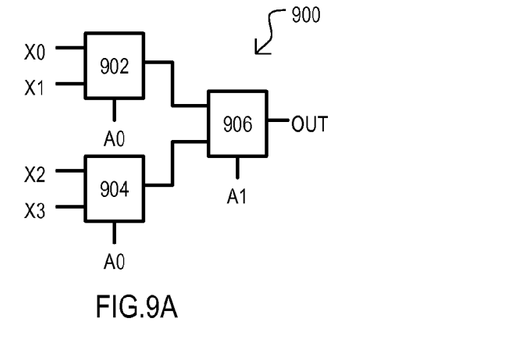
FIG. 9A is a block diagram of a four-to-one multiplexer.

Referring now to FIG. 9A, yet another circuit according to an embodiment is shown in a block diagram and designated by the general reference character 900. FIG. 9A shows one example of a four-to-one multiplexer (MUX). Four-to-one MUX 900 can include two-to-one MUXs 902, 904, and 906. Four-to-one MUX 900 can receive input signals (X0 to X3), select signals (A0 and A1) and provides an output signal OUT. Two-to-one MUX 902 can receive input signals (X0 and X1), select signal A0 and provides an output as an input to two-to-one MUX 906. Two-to-one MUX 904 can receives input signals (X2 and X3), select signal A0 and provides an output as another input two-to-one MUX multiplexer 906. Two-to-one MUX 906 can receive select signal A1 and provides output signal OUT.

Four-to-one MUX 900 can operate to pass one of four input signals (X0 to X3) to the output signal OUT in accordance with the values of select signals (A0 to A1).

Figure 9B:
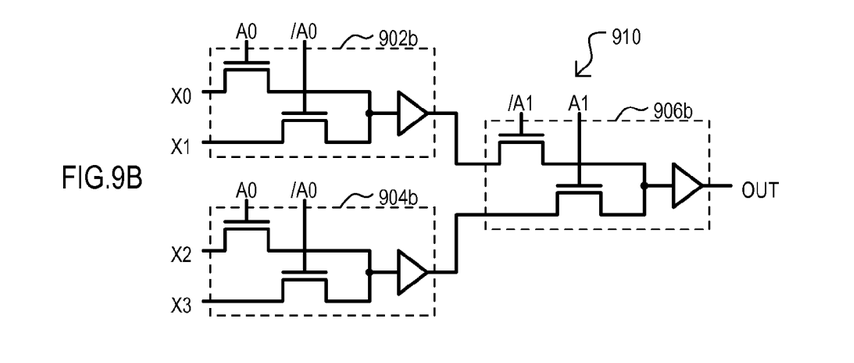
FIG. 9B is a circuit schematic diagram of a conventional CMOS four-to-one multiplexer.

Referring now to FIG. 9B, a circuit schematic diagram of a conventional CMOS four-to-one MUX is set forth and given the general reference character 910. Conventional CMOS four-to-one MUX 910 has the same logic function as four to one multiplexer 900.

Conventional CMOS four to one multiplexer 910 includes two-to-one MUXs 902b, 904b, and 906b. Conventional CMOS four-to-one MUX 910 receives input signals (X0 to X3), complementary select signals (A0, /A0 and A1, /A1) and provides an output signal OUT. Two-to-one MUX 902b receives input signals (X0 and X1), complementary select signals (A0 and /A0) and provides an output as an input to two-to-one MUX 906b. Two-to-one MUX 904b receives input signal signals (X2 and X3), complementary select signals (A0 and /A0) and provides an output as an input to multiplexer 906. Two-to-one MUX 906b receives complementary select signals (A1 and /A1) and provides output signal OUT.

Figure 9C:
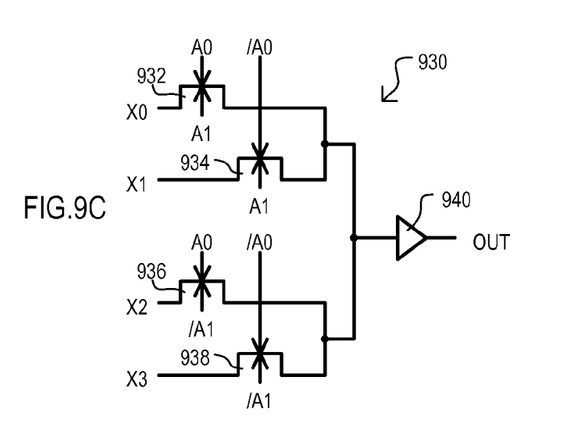
FIG. 9C is a circuit schematic diagram of a four-to-one multiplexer according to an embodiment.

Referring now to FIG. 9C, a circuit schematic diagram of a four-to-one MUX according to an embodiment is set forth and given the general reference character 930. Four-to-one multiplexer 930 uses 4T complementary FETs.

Four-to-one MUX 930 can receive input signals (X0 to X3), complementary select signals (A0, /A0 and A1, /A1) and provides an output signal out. Four-to-one MUX 930 has the same logic function as four to one multiplexers (900 and 910) of FIGS. 9A and 9B.

Four-to-one MUX 930 can include 4T NFETs 932, 934, 936, and 938 and a buffer 940. 4T NFETs (932, 934, 936, and 938) can each be four terminal n-channel JFETs having a front gate and a back gate.

4T NFET 932 can have a front gate connected to receive select signal A0, a back gate connected to receive select signal A1, a first drain/source connected to receive input signal X0, and a second drain/source connected to the input of buffer 940. 4T NFET 934 has a front gate connected to receive select signal /A0, a back gate connected to receive select signal A1, a first drain/source connected to receive input signal X1, and a second drain/source connected to the input of buffer 940. 4T NFET 936 has a front gate connected to receive select signal A0, a back gate connected to receive select signal /A1, a first drain/source connected to receive input signal X2, and a second drain/source connected to the input of buffer 940. 4T NFET 938 has a front gate connected to receive select signal /A0, a back gate connected to receive select signal /A1, a first drain/source connected to receive input signal X3, and a second drain/source connected to the input of buffer 940. Buffer 940 provides output signal out.

Four input multiplexer 930 can operate according to the truth table shown in Table III.

TABLE III

| A1 | A0 | OUT |
|----|----|-----|
| 0  | 0  | X3  |
| 0  | 1  | X2  |
| 1  | 0  | X1  |
| 1  | 1  | X0  |

As can be seen, a four-to-one multiplexer 930 can substantially reduce a device count compared to a conventional CMOS four-to-one multiplexer 910.

Various embodiments of the present invention can also be utilized to impose high impedance states at particular nodes. An example of one such circuit is shown in FIG. 10.

Figure 10:
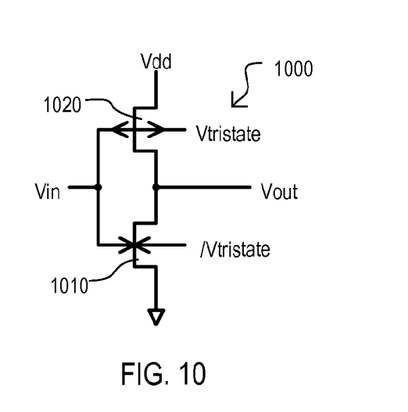
FIG. 10 is a circuit schematic diagram of a tri-state driver according to an embodiment.

FIG. 10 is a circuit schematic diagram of a tri-state driver according to an embodiment is set forth and given the general reference character 1000.

Tri-state driver 1000 receives an input signal Vin a tri-state enable signal Vtristate and provides an output signal Vout. Tri-state driver 1000 can include a 4T NFET 1010 and a 4T PFET 1020. 4T NFET 1010 has a front gate connected to receive input signal Vin, a back gate connected to receive a complementary tri-state enable signal /Vtristate, a drain connected to output signal Vout, and a source connected to ground. 4T PFET 1020 has a front gate connected to receive input signal Vin, a back gate connected to receive tri-state enable signal Vtristate, a source connected to power supply Vdd, and a drain connected to output signal Vout.

Tri-state driver 1000 can operates as a driver/inverter when tri-state enable signal Vtristate is logic low and complementary tri-state enable signal /Vtristate is logic high. However, when tri-state enable signal Vtristate is logic high and complementary tri-state enable signal /Vtristate is logic low, tri-state driver 1000 may be in a tri-state condition, as 4T FETs 1020 and 1010 can be placed into a high impedance state.

In this way, complementary 4T FETs can be utilized to place a circuit node in a high impedance state.

The present invention can also be used for dynamic storage of data values. One such example is shown in FIG. 11A.

Figure 11A:
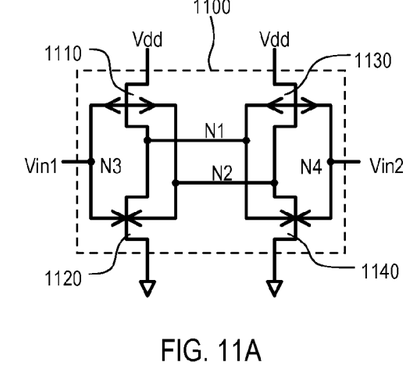
FIG. 11A is a circuit schematic diagram of a flip-flop according to an embodiment.

FIG. 11A is a circuit schematic diagram of a flip-flop according to an embodiment is set forth and given the general reference character 1100.

Flip-flop 1100 can receive input signals (Vin1 and Vin2) as inputs at nodes N3 and N4, respectively. Flip-flop 1100 includes 4T NFETs (1120 and 1140) and 4T PFETs (1110 and 1130). 4T PFET 1110 has a front gate connected to node N3, a back gate connected to an internal latch node N2, a source connected to power supply Vdd, and a drain connected to an internal latch node N1. 4T NFET 1120 has a front gate connected to node N3, a back gate connected to internal latch node N2, a source connected to ground, and a drain connected to internal latch node N1. 4T PFET 1130 has a front gate connected to node N4, a back gate connected to internal node N1, a source connected to power supply Vdd, and a drain connected to internal node N2. 4T NFET 1140 has a front gate connected to node N4, a back gate connected to internal node N1, a drain connected to internal node N2, and a source connected to ground.

4T JFETs (1110 and 1120) may form a first inverting circuit and 4T JFETs (1130 and 1140) may form a second inverting circuit. The first inverting circuit can provide internal node N1 as an output to the input of second inverting circuit at back gates, while second inverting circuit provides internal node N2 as an output to the input of first inverting circuit at commonly coupled back gates. In this way, a latch circuit may be formed.

It is understood that either input signal (Vin1 and Vin2), or both such signals in complementary form, can be used to write a data value into flip-flop 1100.

Figure 11B:
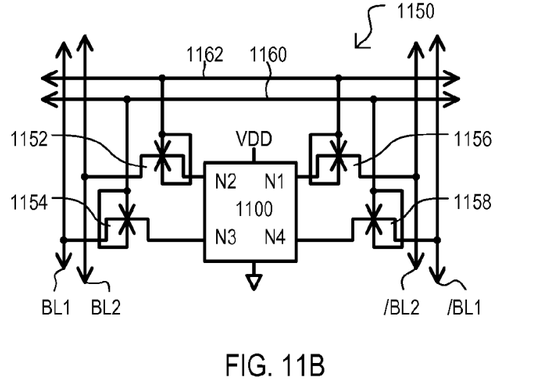
FIG. 11B is a block schematic diagram of a two-port memory cell that can include a flip-flop like that of FIG. 11A.

FIG. 11B shows one particular application of a flip-flop like that shown in FIG. 11A. FIG. 11B is a block schematic diagram of a two-port memory cell 1150. In the example shown, two-port memory cell 1150 can include a flip-flop 1100 like that of FIG. 11A. Such a flip-flop 1100 can include node N1 connected to a bit line /BL2 by a 4T NFET 1156, node N2 connected to a bit line BL2 by a 4T NFET 1152, node N3 connected to a bit line BL1 by a 4T NFET 1154, and node N4 connected to a bit line /BL1 by a 4T NFET 1158.

Devices 1152 and 1156 can have gates commonly connected to a first word line 1160. Devices 1154 and 1158 can have gates commonly connected to a first word line 1162. In such an arrangement, a flip-flop 1100 can be accessed for a read write operation via word line 1162 and bit lines BL1 and /BL1, or via word line 1160 and bit lines BL2 and /BL2.

The present invention can also be utilized to detect variations between different periodic signals. Such embodiments can advantageously utilize both terminals of a 4T FET. An example of such an arrangement is shown in FIGS. 12A to 12D.

Figure 12A:
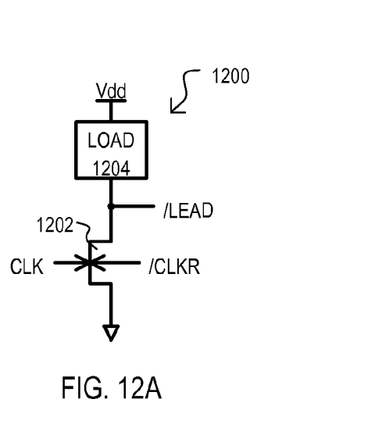
FIG. 12A is a circuit schematic diagram of a lead phase detector according to an embodiment.

Referring to FIG. 12A, a circuit schematic diagram of a lead phase detector according to an embodiment is set forth and given the general reference character 1200.

Lead phase detector 1200 may receive clock signal CLK and reference clock signal /CLKR and may provide a lead signal /LEAD. Lead phase detector 1200 may include 4T NFET 1202 and a load 1204. 4T NFET 1202 may receive clock signal CLK at a front gate and reference clock signal /CLKR at a back gate. 4T FET 1202 can have a source connected to ground and a drain connected to provide lead signal /LEAD. A load 1204 may be connected between a power supply Vdd and the node providing lead signal /LEAD.

Figure 12B:
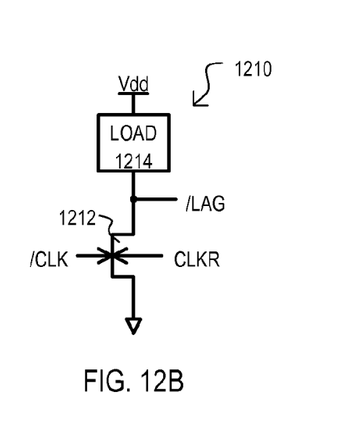
FIG. 12B is a circuit schematic diagram of a lag phase detector according to an embodiment.

Referring to FIG. 12B, a circuit schematic diagram of a lag phase detector according to an embodiment is set forth and given the general reference character 1210.

Lag phase detector 1210 may receive clock signal /CLK and reference clock signal CLKR and may provide a lag signal /LAG. Lag phase detector 1210 may include a 4T NFET 1212 and a load 1214. 4T NFET 1212 may receive clock signal /CLK at a front gate and reference clock signal CLKR at a back gate. 4T NFET 1212 may have a source connected to ground and a drain connected to lag signal /LAG. Load 1214 may be connected between a power supply Vdd and a node providing lag signal /LAG.

Figure 12C:
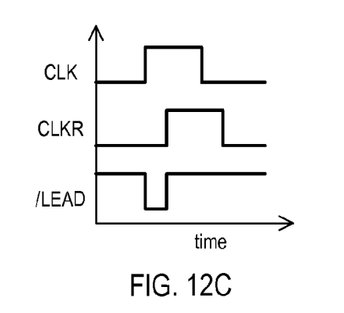
FIG. 12C is a timing diagram illustrating the operation of the lead phase detector of FIG. 12A.
Figure 12D:
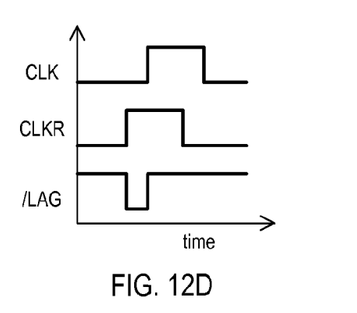
FIG. 12D is a timing diagram illustrating the operation of the lag phase detector of FIG. 12B.

Referring now to FIG. 12D, a timing diagram shows the operation of lead phase detector 1200 of FIG. 12A. When clock signal CLK leads reference clock signal CLK (reference clock signal /CLKR is reference clock signal CLKR inverted), 4T NFET 1202 can be turned on and lead signal /LEAD can transition low for the amount of time of the lead.

Referring now to FIG. 12C, a timing diagram illustrating the operation of lag phase detector 1210 is set forth. When clock signal CLK (clock signal /CLK is clock signal CLK inverted) lags reference clock signal CLKR, IGFET 1212 is turned on and lag signal /LAG transitions low for the amount of time of the lag.

The various embodiments can further include logic block control circuits.

Figure 13A:
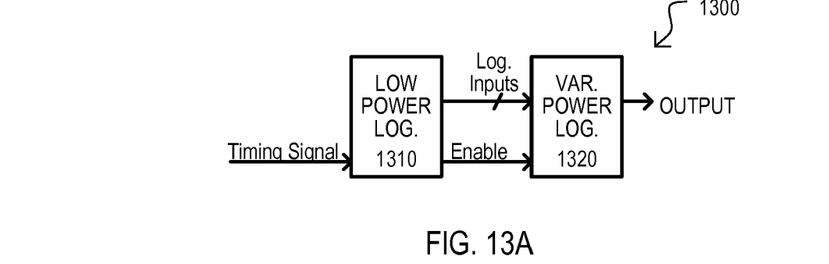
FIG. 13A is a block schematic diagram of a dual mode logic circuit according to an embodiment.

Referring now to FIG. 13A, a dual mode logic circuit according to an embodiment is set forth in a block schematic diagram and given the general reference character 1300. Dual mode logic circuit 1300 may include a low power logic circuit 1310 and a variable speed logic circuit 1320. Low power logic circuit 1310 may receive a timing signal timing signal and may provide an enable signal enable. Variable speed logic circuit 1320 can receive enable signal enable and logic inputs logic inputs, and may provide one or more outputs output based on logic values of logic inputs logic inputs.

Figure 13B:
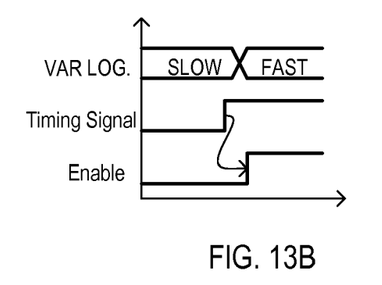
FIG. 13B is a timing diagram illustrating the operation of dual mode logic circuit of FIG. 13A.

Referring now to FIG. 13B, a timing diagram illustrating the operation of dual mode logic circuit 1300 according to an embodiment is set forth. When timing signal timing signal is inactive, low power logic circuit 1310 provides enable signal enable having an inactive level. For example, when an integrated circuit is in a low power mode and/or low power logic circuit 1310 is not outputting any valid signals, enable signal enable can be inactive.

When enable signal enable is at a low logic level, variable speed logic circuit 1320 can operate in a low power, or slow mode.

In contrast, when timing signal is active, low power logic circuit 1310 can provide an enable signal enable that is active. For example, when an integrated circuit is in a high power mode and/or low power logic circuit 1310 is outputting valid signals, enable signal enable can be active.

When enable signal enable is active, variable speed logic circuit 1320 can switch from a slow mode to a fast mode (i.e. higher switching current). In this way, variable speed logic circuit 1320 may operate in a low power mode when timing is not critical or when logic inputs have not stabilized, for example, and power consumption may be reduced.

Variable speed logic circuit 1320 can include 4T FET devices and enable signal enable (or its inverse, according to the conductivity of the device) may be provided to one gate (preferably a back gate) of selected JFET devices in order to modulate the drive strength of the selected devices. In this way, the power consumption and speed of the fast logic circuit may be increased at predetermined times.

Figure 14:
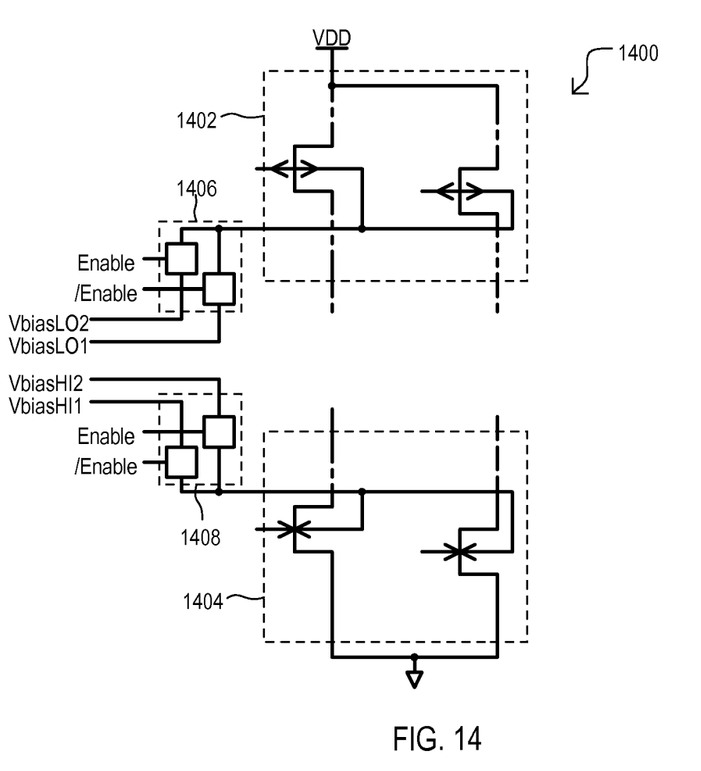
FIG. 14 is a block schematic diagram showing dual mode logic according to an embodiment.

Referring now to FIG. 14, one example of dual mode logic, like that shown as 1320 in FIG. 13A, is shown in a block schematic diagram, and designated by the general reference character 1400. Dual mode logic 1400 can include a group of 4T PFETs 1402 and a group of 4T NFETs 1404. Within group 1402 one gate of each 4T PFET can receive an input signal or be connected to an internal logic node to provide a desired function. At the same time, the other gate of each such 4T PFET can be connected to one of two low bias voltages VbiasLO1 or VbiasLO2 by switching circuit 1406. Low bias voltage VbiasLO2 can be lower in potential than the VbiasLO1.

Referring still to FIG. 14, within group 1404 one gate of each 4T NFET can receive an input signal or be connected to an internal logic node to provide a desired function. At the same time, the other gate of each such 4T NFET can be connected to one of two high bias voltages VbiasHI1 or VbiasHI2 by switching circuit 1408. High bias voltage VbiasHI2 can be higher in potential than the VbiasHI1.

Each switching circuit 1406 and 1408 can provide low impedance paths to a corresponding bias voltage based on signal Enable and its complement /Enable.

In this way, in a first mode of operation (e.g., low power, low speed), 4T FETs can have channel conductivities affected by gate voltages VbiasLO1 and VbiasHI1. However, in a second mode of operation (e.g., high power, high speed), 4T FETs can have channel conductivities affected by gate voltages VbiasLO2 and VbiasHI2, which can increase channel conductivity over the first mode of operation.

It is noted that 4T JFETs devices, according to the embodiments, can include pn junctions between a gate and source/drains. For this reason, a power supply voltage may be set to no more than 0.6 volts in order to prevent forward biasing of these junctions. Power supply voltages may be substantially lower than 0.6 volts.

According to other embodiments of the present invention, 4T JFET devices can form analog circuits for various applications, including but not limited to, signal generation and/or signal processing. Two of the many possible examples of such embodiments are shown in FIGS. 15 and 16.

Figure 15:
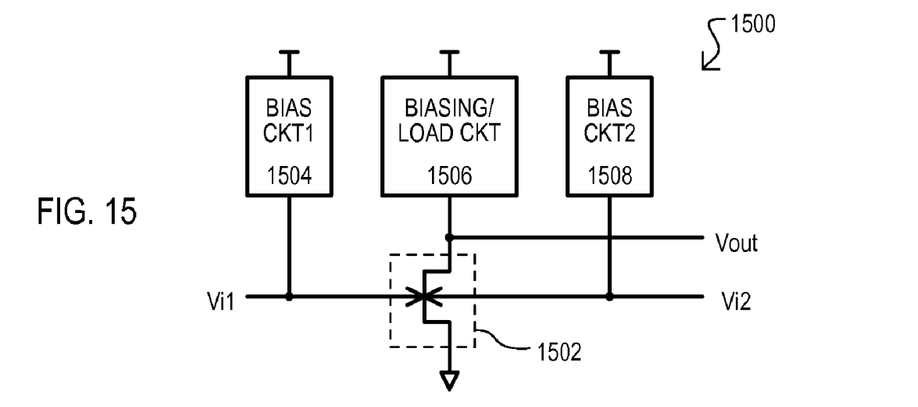
FIG. 15 is a block schematic diagram of an amplitude modulation circuit according to an embodiment.

Referring to FIG. 15, an amplitude modulation (AM) circuit is shown in a block schematic diagram and designated by the general reference character 1500. An AM circuit 1500 can include a 4T NFET 1502, a first biasing circuit 1504 for front gate, a biasing/load circuit 1506, and a second biasing circuit 1508 for the back gate. Biasing circuits 1504 to 1508 can bias 4T NFET 1502 to operate in a linear mode. A linear mode region implies that the drain current is linearly proportional to the input voltage.

4T NFET can receive a first input signal Vi1 at a front gate, a second input signal Vi2 at a back gate, and provide an output signal Vout at a node between a drain and biasing/load circuit 1506.

Figure 16:
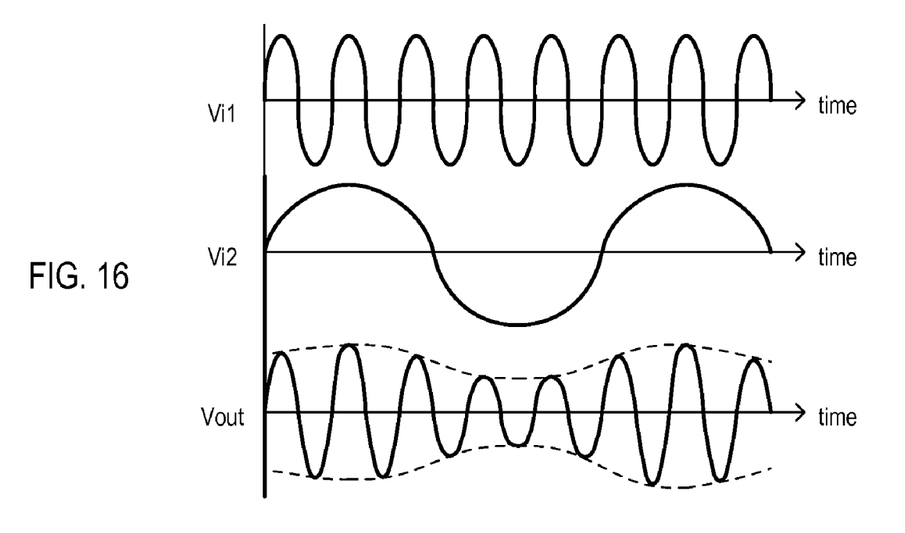
FIG. 16 is a timing diagram showing the operation of the circuit of FIG. 15.

The operation of the circuit of FIG. 15 is shown in FIG. 16. A signal Vi1 can be a periodic carrier signal. A signal Vi2 can be a data signal. As the data signal Vi2 varies, the channel impedance of 4T NFET will vary correspondingly. As a result, a current drawn at a drain of 4T NFET 1502 (and hence the potential generated by biasing/load circuit 1506) will vary, modulating the input signal to generate an amplitude modulated output signal Vout. Drain current (Id) can follow the relationship:

$$Id=K_1 Vi1+K_2 Vi2$$

where $K_1$ is a linear transfer characteristic with respect to the front gate, and $K_2$ is a linear transfer characteristic with respect to the back gate.

Of course, the embodiments are not limited to having 4T JFETs devices operating in a linear mode of operation. Other embodiments can include a 4T JFET devices operating in a nonlinear mode. One of the many possible examples is shown in FIG. 17.

Figure 17:
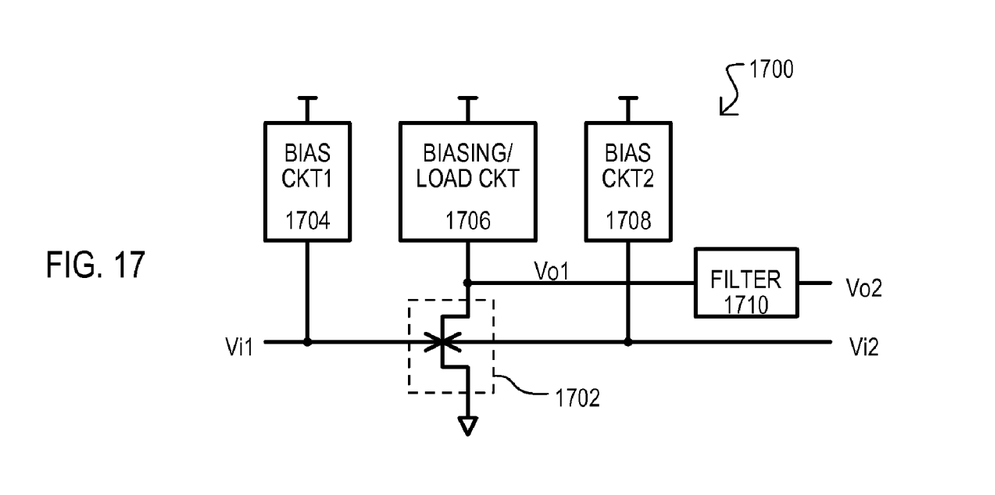
FIG. 17 is a block schematic diagram of an amplifier/demodulator according to an embodiment.

FIG. 17 shows a one-stage amplifier/demodulator circuit 1700 having a 4T NFET 1702, a first biasing circuit 1704, a biasing/load circuit 1706, a second biasing circuit 1708, and a filter circuit 1710.

In the arrangement of FIG. 17, a 4T NFET can be biased to operate in a nonlinear mode. As a result a drain current that follows the relationship $$Id=K_1 Vi1^a+K_2 Vi2^b,$$

where $a \neq 1$ and $b \neq 1$.

In the described application, input signals can vary as noted below, resulting in a voltage (Vo1) at the drain of 4T NFET 1702 as shown below:

$$Vi1=V_{01}\sin(\omega_1 t+\phi_1),$$

$$Vi2=V_{02}\sin(\omega_2 t+\phi_2),$$

$$Vo1=f\{(\omega_1+\omega_2),(\omega_1-\omega_2)\ldots\}$$

Filter circuit 1710 can then filter signal Vo1 to output desired frequency components. As but one example, filter circuit 1710 can operate as a low pass filter to generate an output signal Vo2 as follows:

$$Vo2=f(\omega_1-\omega_2).$$

Alternately, the filter circuit 1710 can operate as a high pass/band pass filter to generate an output signal Vo2 as follows;

$$Vo2=f(\omega_1+\omega_2).$$

In yet another embodiment, the present invention can also be used for pulse width modulation. One such example is shown in FIG. 18A.

Figure 18A:
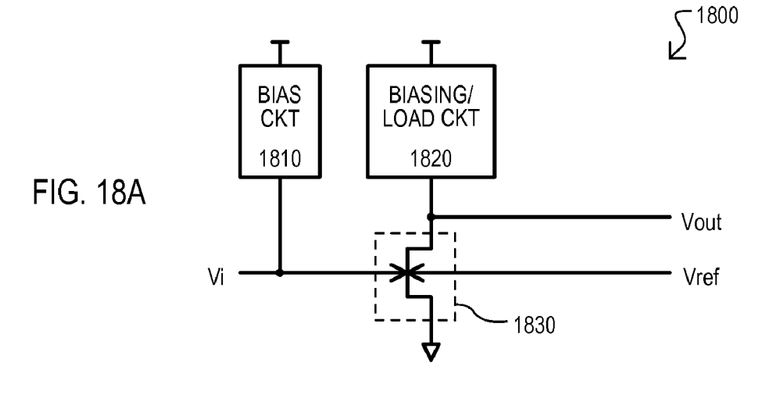
FIG. 18A is block schematic diagram of a pulse width modulation (PWM) circuit according to an embodiment.

Referring now to FIG. 18A, a circuit schematic diagram of a pulse width modulation circuit according to an embodiment is set forth and given the general reference character 1800.

Pulse width modulation circuit 1800 can receive an input signal Vi and a reference signal Vref and may provide a modulated output signal Vout. Pulse width modulation circuit 1800 can include a biasing circuit 1810, a biasing load 1820, and a 4T NFET 1830. Biasing circuit 1810 may receive a power supply Vdd at one terminal and may be connected to a front gate of 4T NFET 1830. 4T NFET 1830 may receive input signal Vi at a front gate and reference signal Vref at a back gate. 4T NFET 1830 may have a drain connected to the node providing output signal Vout and a source connected to ground. Biasing load 1820 may receive power supply Vdd at one terminal and may have another terminal connected to the node providing output signal Vout.

Figure 18B:
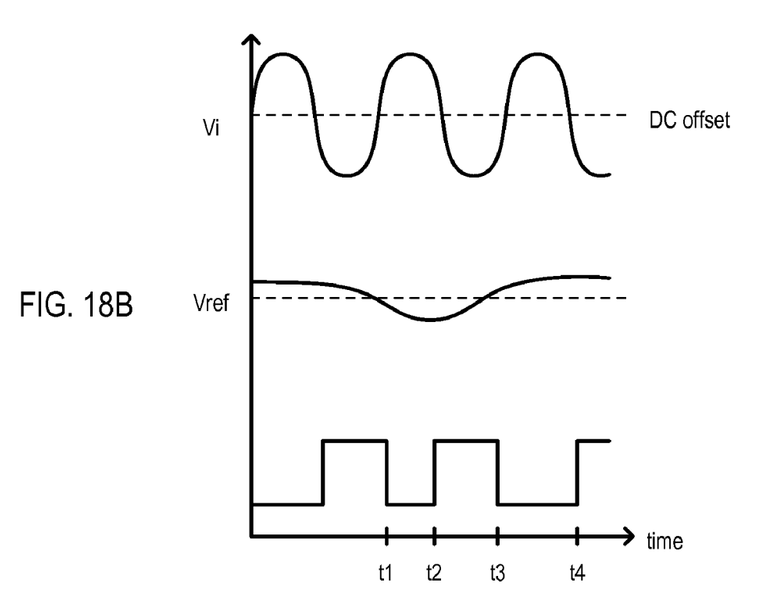
FIG. 18B is a timing diagram showing the operation of the circuit of FIG. 18A.

Referring now to FIG. 18B, a timing diagram illustrating the operation of pulse width modulation circuit 1800 according to an embodiment is set forth.

Biasing circuit 1810 may provide a DC offset bias to the front gate of 4T NFET 1830. Input signal Vi may provide an AC signal to the DC offset bias. The DC offset bias voltage may be chosen with respect to a threshold voltage of 4T NFET 1830. Reference signal Vref may be provided to the back gate of 4T NFET to modulate the front gate threshold voltage of 4T NFET 1830.

The duty cycle of input signal Vi may be modulated accordingly to provide modulated output signal Vout. This can be illustrated in FIG. 18B, when reference signal Vref is at a relatively low voltage level, the front gate threshold voltage of 4T NFET 1830 may be shifted above the DC bias provided by biasing circuit 1810 and output signal Vout may have a narrower low pulse width as illustrated between times t1 and t2. However, when reference signal Vref is at a relatively high voltage level, the front gate threshold voltage of 4T NFET 1830 may be shifted below the DC bias provided by biasing circuit 1810 and output signal Vout may have a wider low pulse width as illustrated between times t3 and t4. In this way, a pulse width modulation circuit 1800 may modulate a pulse width of input signal Vi by essentially using an intersective method by determining a modulated output signal based on an intersection of input signal Vi and a modulated threshold voltage of 4T NFET 1830.

In this way, a 4T JFET can operate in a linear mode or nonlinear mode to provide various analog circuit functions. In the above description, for purposes of explanation, numerous specific details are set forth in order to provide a thorough understanding of the present invention. It will be evident, however, to one skilled in the art that the present invention may be practices without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A logic circuit, comprising:
    at least one input node;
    at least one output node; and
    a plurality of junction field effect transistors (JFETs) coupled between the at least one input node and output node, each JFET including a first gate and a second gate of a first conductivity type and a channel region of a second conductivity type between the first gate and second gate, the channel region connecting a source region to a drain region both of the second conductivity type, the second gate being separately controllable with respect to the first gate.

2. The logic circuit of claim 1, wherein
    the channel region of each JFET does not extend between portions of the first gate.

3. The logic circuit of claim 1, wherein:
the plurality of JFETs includes at least one n-channel JFET having a source-drain path coupled between a first internal node and a low power supply node and at least one p-channel JFET having a source-drain path coupled between the first internal node and a high power supply node.

4. The logic circuit of claim 3, wherein:
the at least one p-channel JFET has a front gate coupled to a first input node and a back gate coupled to a first predetermined potential, and the at least one n-channel JFET has a front gate coupled to the first input node and a back gate coupled to a second predetermined potential, the first internal node is coupled to the output node, and the logic circuit provides an inverter function.

5. The logic circuit of claim 1, wherein:
the plurality of JFETs includes at least one input switching JFET having a first end of a source-drain path coupled to a first input node, a front gate coupled to a first signal node and a back gate connected to a second signal node, the first input node and second input nodes varying the threshold voltage of the at least one input switching JFET; and
a driver circuit having an input coupled to a second end of the source-drain path that drives an driver output signal between at least first and second levels based on the threshold voltage of the at least one JFET.

6. The logic circuit of claim 1, wherein:
the at least one JFET includes
a first JFET having a source-drain path coupled between a first input node and a first output node, a front gate coupled to receive a first multiplexer (MUX) control signal, a back gate coupled to receive a second MUX control signal, and
a second JFET having a source-drain path coupled between a second input node and the first output node, a front gate coupled to receive an inverse first MUX control signal, a back gate coupled to receive an inverse second MUX control signal.

7. The logic circuit of claim 1, wherein:
the first gate of each JFET includes a polycrystalline semiconductor material formed over a monocrystalline semiconductor substrate, and the second gate each JFET is formed in the monocrystalline semiconductor substrate, below the first gate of the same JFET.

8. A circuit, comprising:
a plurality of junction field effect transistors (JFETs) each having a front gate and a back gate, including at least one first conductivity type JFET having a source-drain path coupled between a first power supply node and an internal node, and at least one second conductivity type JFET having a source-drain path coupled between a second power supply node and the internal node; wherein
that at least one first conductivity type JFET has a front gate coupled to a first input node and a back gate coupled to a second input node, and the at least one second conductivity type JFET has a front gate coupled to the first input node.

9. The circuit of claim 8, wherein:
the at least one second conductivity type JFET includes a back gate coupled to the second input node.

10. The circuit of claim 8, wherein:
the at least one second conductivity type JFET includes a back gate coupled to a third input node.

11. The circuit of claim 8, wherein:
the at least one first conductivity type JFET includes a plurality of first conductivity type JFETs having source-drain paths coupled in parallel with one another between the first power supply node and the internal node; and
the at least one second conductivity type JFET includes a plurality of second conductivity type JFETs having source-drain paths coupled in series with one another between the second power supply node and the internal node.

12. The circuit of claim 8, wherein:
the channel region of each JFET does not extend between portions of the top gate.

13. The circuit of claim 8, wherein:
the top gate of each JFET includes a polycrystalline semiconductor material formed over a monocrystalline semiconductor substrate, and the bottom gate each JFET is formed in the monocrystalline semiconductor substrate, below the first gate of the same JFET.

14. The circuit of claim 8, wherein:
at least one of the first conductivity type JFETs is a single gate depletion mode device that provides a low impedance source-drain path in response to either its top gate or bottom gate being at a first logic level; and
at least one of the second JFETs is a single gate enhancement mode device that provides a low impedance source-drain path in response to only both its top gate and bottom gate being at the first logic level.

15. A storage circuit, comprising:
a first JFET of a first channel conductivity type having a source coupled to a first supply node, a drain coupled to a first latch node, a first gate coupled to a first input node, and a second gate coupled to a second latch node; and
a second JFET of the first channel conductivity type having a source coupled to the first supply node, a drain coupled to the second latch node, a first gate coupled to a second input node, and a second gate coupled to the first latch node.

16. The storage circuit of claim 15, further including:
a third JFET of a second channel conductivity type having a source coupled to a second supply node, a drain coupled to the first latch node, a first gate coupled to the first input node, and a second gate coupled to the second latch node; and
a fourth JFET of the second channel conductivity type having a source coupled to the second supply node, a drain coupled to the second latch node, a first gate coupled to the second input node, and a second gate coupled to the first latch node.

17. The circuit of claim 15, further including:
a first access JFET having a source-drain path coupled between the first input node and a first bit line, and at least one gate coupled to a first word line.

18. The circuit of claim 17, further including:
a second access JFET having a source-drain path coupled between the first latch node and a second bit line, and at least one gate coupled to a second word line.

19. The circuit of claim 8, wherein:
the channel region of at least the first JFET does not extend between portions of the first gate of the first JFET.

20. The circuit of claim 8, wherein:
the first gate of at least the first JFET includes a polycrystalline semiconductor material formed over a monocrystalline semiconductor substrate, and the second gate of at least the first JFET is formed in the monocrystalline semiconductor substrate, below the first gate of the same JFET.

* * * * *